US009869582B2

(12) United States Patent
Margulis

(10) Patent No.: US 9,869,582 B2
(45) Date of Patent: Jan. 16, 2018

(54) METHOD AND DEVICE FOR CONTROL OF AVALANCHE PHOTO-DIODE CHARACTERISTICS FOR HIGH SPEED AND HIGH GAIN APPLICATIONS

(71) Applicant: APPLIED MATERIALS ISRAEL LTD., Rehovot (IL)

(72) Inventor: Pavel Margulis, Ashdod (IL)

(73) Assignee: APPLIED MATERIALS ISRAEL LTD., Rehovot (IL)

(*) Notice: Subject to any disclaimer, the term of this patent is extended or adjusted under 35 U.S.C. 154(b) by 193 days.

(21) Appl. No.: 14/948,012

(22) Filed: Nov. 20, 2015

(65) Prior Publication Data
US 2016/0076938 A1 Mar. 17, 2016

Related U.S. Application Data

(63) Continuation-in-part of application No. 14/245,282, filed on Apr. 4, 2014, now Pat. No. 9,269,835.

(51) Int. Cl.
*H01L 31/024* (2014.01)
*H01L 31/02* (2006.01)
*G01J 1/44* (2006.01)
*H04B 10/69* (2013.01)

(52) U.S. Cl.
CPC .......... *G01J 1/44* (2013.01); *H01L 31/02027* (2013.01); *H04B 10/6911* (2013.01); *G01J 2001/444* (2013.01); *G01J 2001/4466* (2013.01)

(58) Field of Classification Search
CPC ................ H04N 5/361; H01L 31/0248; H01L 31/02027; G05F 1/567
See application file for complete search history.

(56) References Cited

U.S. PATENT DOCUMENTS 4,599,527 A 7/1986 Beaudet et al.
5,696,657 A 12/1997 Nourrcier, Jr. et al.

FOREIGN PATENT DOCUMENTS

WO 03/069379 A2 8/2003
WO 2007/030734 A2 3/2007

OTHER PUBLICATIONS

English machine translation of JPH05-243588 A, 11 pages.
Refaat, T. et al., "Temperature Control of Avalanche Photodiode Using Thermoelectric Cooler" NASA/TM-199-209686 (Oct. 1999), 22 pages.

(Continued)

*Primary Examiner* — Renee Chavez
(74) *Attorney, Agent, or Firm* — Kilpatrick Townsend & Stockton LLP

(57) ABSTRACT

A device that may include a DC power supply coupled to a fixed current source; an APD; a DC voltage regulator that comprises a regulating transistor, arranged to maintain a regulated voltage at a fixed value over different APD currents; a temperature control module that is arranged to maintain a portion of the temperature control module at a fixed temperature; and compensation circuit that comprises a compensation component that is thermally coupled to the APD. A voltage drop over the compensation component is smaller than a voltage drop over the APD. A sum of (a) a current that pass through the APD and (b) a current that passes through the compensation component is fixed. The portion of the temperature control module is thermally coupled to the compensation component and to the APD.

14 Claims, 16 Drawing Sheets

(56) References Cited

OTHER PUBLICATIONS

CMC Electronics, "Receiver TIA with TEC and HV Regulator, 200μm InGaAs APD (Avalanche Photodiode)" www.cmcelectronics.ca 264-339746-001, (2014), 4 pages.
Advanced Photonix, "Cooled OEM Modules" www.advancedphotonix.com (2014), 2 pages.
Voxtel Inc., NIR Avalanche Photodiodes Photoreceivers Catalog (2011), 54 pages.
Garcia et al., "Low-cost Temperature Stabilization in APD Photo Sensors by means a High Frequency Switching DC/T Converter" IEEE Instrumentation and Measurement Technology Conference, Anchorage, AK (May 2002), 5 pages.
Ex Parte Quayle Action of Oct. 5, 2015 for U.S. Appl. No. 14/245,282, 9 pages.
Notice of Allowance dated Nov. 6, 2015 for U.S. Appl. No. 14/245,282, 8 pages.

METHOD AND DEVICE FOR CONTROL OF AVALANCHE PHOTO-DIODE CHARACTERISTICS FOR HIGH SPEED AND HIGH GAIN APPLICATIONS

CROSS-REFERENCES TO RELATED APPLICATIONS

The present application is a continuation-in-part of U.S. application Ser. No. 14/245,282, filed Apr. 4, 2014, the entire contents of which are incorporated herein by reference in their entirety for all purposes.

BACKGROUND

Avalanche photo-diode (APD) is a solid-state photo-sensor with internal gain.

When light signal is applied to APD, it generates current (I) that equals a product of a multiplication of the power (P) of light that impinges on the APD, the photo-sensitivity (S) of the APD and the gain (M) of the APD. The Gain (M) is also referred to as an internal gain of the APD.

The power (P) may be measured in Watts [W], the photo-sensitivity (S) may be measured in Ampere per Watts [A/W] and the gain (M) may be measured in Ampere per Ampere [A/A].

The Value of the gain depends on a value of a voltage applied to the APD (hereinafter APD voltage or VAPD) and the APD junction temperature. This dependence is especially strong for high values of the gain. For simplicity of explanation it is assumed that the APD temperature is the temperature of the APD junction on which light impinges. The APD junction temperature is referred to as APD temperature. It is known in the art that the ability to use an APD in high gain applications directly depends on the stability of the APD voltage and voltage noise as well as on the stability of the APD temperature. For example, highly sensitive optical systems may aim for using APD at a gain of 500 and at APD current (IAPD) of 300 microAmpere. Under such requirements, APD junction temperature variation of about 0.05 Celcius may cause an APD current variation (which, for some application, represent an error) of 1/256=0.004=0.4%. A 0.4% error is high enough in order to interfer the correct work of highly sensitive optical systems. Known APD-based systems support APD temperature variations of about 1.0 Celcius, which increases error level above and beyond the requirements of certain highly sensitive optical systems.

The following publications relate to APD, operation of APD at high gain and APD temperature: International Publication Nos. WO2007/030734; WO2003/069379. U.S. Pat. Nos. 4,599,527; 5,696,657; Perez Garcia M. A. et al, "Low-cost Temperature Stabilization in APD Photo Sensors by means a High Frequency Switching DC/T Converter", IEEE Instrumentation and Measurement Technology conference Anchorage, Ak., USA, 2 1-23 May 2002; Tamer F. Refaat "Temperature Control of Avalanche Photodiode Using Thermoelectric Cooler", NASA/TM-1999-209689, October 1999; "Voxtelopto NIR Photodiodes Photoreceivers Catalog" by Voxtel™, Inc. 2011; "Spec Sheet: Advanced Photonix OEM Modules—Cooled", http://proddownloads.vert-markets.com/download/facdabea/facdabea-b890-44cf--8e01-2354c1f4c0cf/original/oemcooled.pdf; "Microelectronucs Receiver TIA with TEC and HV Regulator, 200 µm InGaAs APD (Avalanche Photodiode) 264-339746-001" by CMC Electronics™.

It is noted that APD temperature is influenced by the APD average current (static current) and by fast APD current changes (dynamic current). Furthermore, in order to prevent APD damage the level of the average APD current should be limited. For example, the average APD current may be limited to a level of few tens of micro-Amperes till few hundreds micro-Amperes (for example, 500 micro Ampere). An APD current dynamic range in practice may be five decades, i.e. 100,000, or even more, and APD current's frequency range may be in the range of few tens of GHz.

The electrical power dissipated on an APD (P) equals IAPD*VAPD. This electrical power is directly converted to heat. If the APD is maintained at a fixed gain then the value of the APD voltage is constant. Therefore, heat dissipated on the APD may change, for example in the range of 100,000 times.

It has been found that the APD temperature changes over time and this induces changes in the gain of the APD. Thus, static or/and dynamic non-linearity of APD response are experienced and this is undesired for certain applications.

Typically, The APD voltage may be set to values between 0V and 500V, depending on required APD gain (the higher limit may be between 5V and few thousand of volts 3,000V for different technologies of APD). Together with wide APD current dynamic range (static and dynamic) it sets significant challenge to designer of bias voltage supply system.

The APD gain may be between 1 A/A and few thousands A/A. For APD gain in the range of few hundreds and for an allowed error of not more than 1/256=0.4%, the required stability of the APD voltage is in range of few tens of mV peak-to-peak (voltage domain) and the required stability of the APD temperature is in range of few tens of milli-degrees (temperature domain). For gains of one thousand and more above requirements are even tighter.

FIG. 1 is a schematic diagram of a prior art device 201 that includes: (a) Controller 19. (b) Direct current to direct current (DC-DC) converter 11 that serves as a high voltage supply module for providing the APD voltage (VAPD 102). DC-DC converter 11 is controlled by a control signal APD HV set 101 that is supplied by controller 19. (c) APD 13. (d) First capacitor C1 12 that filters the voltage supplied to APD 13. (e) Trans-impedance amplifier (TIA) 14 that includes amplifier U1 11 and a feedback resistor R11 15. TIA 14 is arranged to output via output port 16 an output voltage VOUT 104, wherein VOUT=IAPD*R11. FIG. 1 also shows load resistor such as Rload 17 that is connected to output port 16.

In voltage domain device 201 may suffer from the following problems: DC-DC converter 11 usually has a slow load regulation response (in the range of DC-DC switching frequency, which is about 100 KHz); The time response of the DC-DC converter's output current limiting circuit is slow (in the range of DC-DC switching frequency, which is about 100 KHz); DC-DC converter 11 usually has a high output ripple and noise.

In the temperature domain—the prior art device 201 may suffer from the following problems: There are no special means for APD junction temperature stabilization; therefore, APD 13 may be used with relatively low gains (up to few tens) without to sacrifice APD gain linearity.

FIG. 2 illustrates prior art device 202. Device 202 is connected to a load that is represented by Rload 17.

Prior art device 202 includes: (a) Controller 19. (b) DC-DC converter 11. DC-DC converter 11 is controlled by (i) control signal APD HV set 101 that is supplied by controller 19 and by (ii) an offset signal 105 provided from temperature feedback module 22. (c) APD 13. (d) First capacitor C1 12 that filters the voltage supplied to APD 13. (e) TIA 14. (f) Temperature sensor (TS) 30 for sensing the temperature of APD 13. (g) Temperature feedback module 22 that receives temperature readings from TS 30 and outputs temperature offset signal 105 for compensating for changes in the temperature of the APD 13. This circuit may be included in controller 19 or be separated from the controller 19.

Prior art device 202 allows at least a limited amount of compensation for temperature changes. In voltage domain and for certain applications, this configuration may show the following disadvantages: DC-DC converter 11 usually has slow load regulation response (in the range of tens KHz). The time response of DC-DC converter's output current limiting circuit is slow (in the range of tens KHz). The DC-DC converter 11 usually has high output ripple and noise.

In temperature domain and for certain applications this configuration has following disadvantages: The function, realized by temperature feedback module 22 is complicated (APD gain M depends on both HV and APD temperature), and may be realized properly only in microcontroller with multi-dimensional look-up table (LUT). The time response of the temperature feedback module 22 is slow (in the range of tens KHz).

FIG. 3 illustrates prior art device 203. Device 203 is connected to a load that is represented by Rload 17.

Device 203 includes: (a) Controller 19. (b) DC-DC converter 11. DC-DC converter 11 is controlled by control signal APD HV set 101 that is supplied by controller 19. (c) APD 13. (d) First capacitor C1 12 that filters the voltage supplied to the APD 13. (e) TIA 14. (f) Thermoelectric cooler (TEC) 40 that includes cold plate 41, hot plate 42 and solid state devices 43. Solid state devices 43 transfer heat from cold plate 41 to hot plate 42 under the control a TEC controller 44. TEC 40 includes TS 30 for sensing the temperature of APD 13 or of cold plate 41. TS 30 provides its temperature readings to TEC controller 44. (g) TEC controller 44. TEC controller 44 is also controlled by a temperature set signal 106 from controller 19.

Device 203 allows at least a limited amount of APD temperature control. TEC controller 44 controls the temperature applied by TEC 40 in order to determine the APD temperature and compensate for changes in the APD temperature.

In voltage domain and for certain applications this configuration has following disadvantages: The DC-DC converter 11 usually has slow load regulation response (in the range of tens KHz). The time response of DC-DC converter's output current limiting circuit is slow (in the range of tens KHz). The DC-DC converter 11 usually has high output ripple and noise.

In temperature domain and for certain applications this configuration has following disadvantages: The time response of such temperature compensation is slow (in the range of hundred Hz), which allow APD application with low gains (in the range of 50) with limited APD currents (about 50 uA). The temperature stabilization performance is limited by finite thermal resistance between APD die and cold plate 41.

FIG. 4 is a cross sectional view of a portion 211 of a prior art device. Portion 211 includes: (a) controller 19, (b) TEC 40, (c) TEC controller 44, (d) intermediate plate 50, (e) APD die 71 that is located within a package that is illustrated as having base 61, housing 63 and window 64. APD die 71 includes APD junction 72 that is light sensitive and faces window 64 and is positioned above electrical insulator 62.

Electrical insulator 62 is electrically insulating but thermally conductive. Electrical insulator 62 is supported by base 61. TEC 40 includes cold plate 41, hot plate 42, solid state devices 43 and TEC controller 44. TEC controller 44 is fed by a control signal from controller 19 and by temperature reading from TS 30 that measures the temperature of the cold plate 41 or of intermediate plate 50. Intermediate plate 50 is connected between cold plate 41 and base 61. Intermediate plate 50 is more massive than cold plate 41 and is used for stabilizing the temperature due to its greater mass. It is noted that if cold plate 41 is big enough then intermediate plate 50 may be omitted.

FIG. 4 also illustrates heat flux 401 that is generated by APD die 71 and propagates through electrical insulator 62, base 61 and intermediate plate 50.

FIG. 5 is a cross sectional view of a portion 212 of a prior art device.

Portion 212 differs from portion 211 by the location of TEC 40 and by using the intermediate plate 50 as a hot plate—instead of being used as a cold plate. TEC 40 is located within the package that surrounds APD die 71. Portion 212 includes controller 19, TEC 40, intermediate plate 50 and APD die 71. APD die 71 is located within a package that includes base 61, housing 63 and window 64. TEC controller 44 may be included inside the package or outside the package.

APD die 71 includes a APD junction 72 that faces window 64. APD die 71 is positioned above electrical insulator 62. Electrical insulator 62 is electrically insulating but is thermally conductive.

TEC 40 is positioned between electrical insulator 62 and base 61 so that cold plate 41 may contact electrical insulator 62 and hot plate 42 may contact base 61. TEC 40 also includes TS 30 and solid state devices 43. Intermediate plate 50 is more massive than hot plate 42. Intermediate plate 50 is used for conducting the heat to an external air or fluid.

FIG. 5 also illustrates heat flux 402 that is generated by APD die 71 and propagates through electrical insulator 62 and cold plate 41.

There is a growing need to provide a device that facilitates the APD at high gain values.

SUMMARY

According to an embodiment of the invention there may be provided a device that may include a direct current (DC) power supply coupled to a fixed current source; an avalanche photo-diode (APD); a DC voltage regulator that comprises a regulating transistor, arranged to maintain a regulated voltage at a fixed value over different APD currents; a temperature control module that is arranged to maintain a portion of the temperature control module at a fixed temperature; a compensation circuit that comprises a compensation component that is thermally coupled to the APD; wherein a voltage drop over the compensation component is smaller than a voltage drop over the APD; wherein a sum of (a) a current that pass through the APD and (b) a current that passes through the compensation component is fixed; and wherein the portion of the temperature control module is thermally coupled to the compensation component and to the APD.

According to an embodiment of the invention there may be provided a method that may includes maintaining, by a direct current (DC) voltage regulator, a regulated voltage at a fixed value; wherein the DC voltage regulator comprises a regulating transistor; outputting the regulated voltage to an avalanche photo-diode (APD) that is coupled to the regulating transistor; maintaining, at a fixed value, a sum of (a) a current that pass through the APD and (b) a current that passes through a compensation component that is thermally coupled to the APD; wherein the compensation component belongs to compensation circuit; wherein a voltage drop over the compensation component is smaller than a voltage drop over the APD; and maintaining, by a temperature control module, a portion of the temperature control module at a fixed temperature; and wherein the portion of the temperature control module is thermally coupled to the compensation component and to the APD.

The voltage drop over the compensation component may be smaller than one fourth of the voltage drop over the APD.

The voltage drop over the compensation component may be smaller than one fifth of the voltage drop over the APD.

The voltage drop over the compensation component may be smaller than one tenth of the voltage drop over the APD.

The APD and the compensation component belong to a thermally homogenous region of the device.

The APD and the compensation component are formed in a same die.

The APD and the compensation component are positioned at opposite sides of a thermally conductive electrical insulating layer.

The APD may include an APD die, the compensation component may include a compensation component die; wherein the device may include a thermally coupling element; and wherein the compensation component die and the APD die are spaced apart from each other and are thermally coupled to each other by the thermally coupling element.

The portion of the temperature control module may be a cooling plate of the temperature control module.

The compensation component may be a transistor.

The compensation circuit may include (i) a trans-impedance amplifier that may be coupled between an anode of the APD and an output port of the device, (ii) a configurable voltage amplifier, (iii) a trans-conductance amplifier that may be coupled between the configurable voltage amplifier and the in parallel to the compensation component.

The device may include (a) a ratio between the voltage drop over the APD and the voltage drop over the compensation component equals (b) a product of a trans-impedance of the second trans-impedance amplifier, a gain of the configurable voltage amplifier and a transimpedance of the first trans-impedance amplifier.

The device may include may include a first current source for feeding, with a first fixed current, a junction that may be coupled to the APD and regulating transistor

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
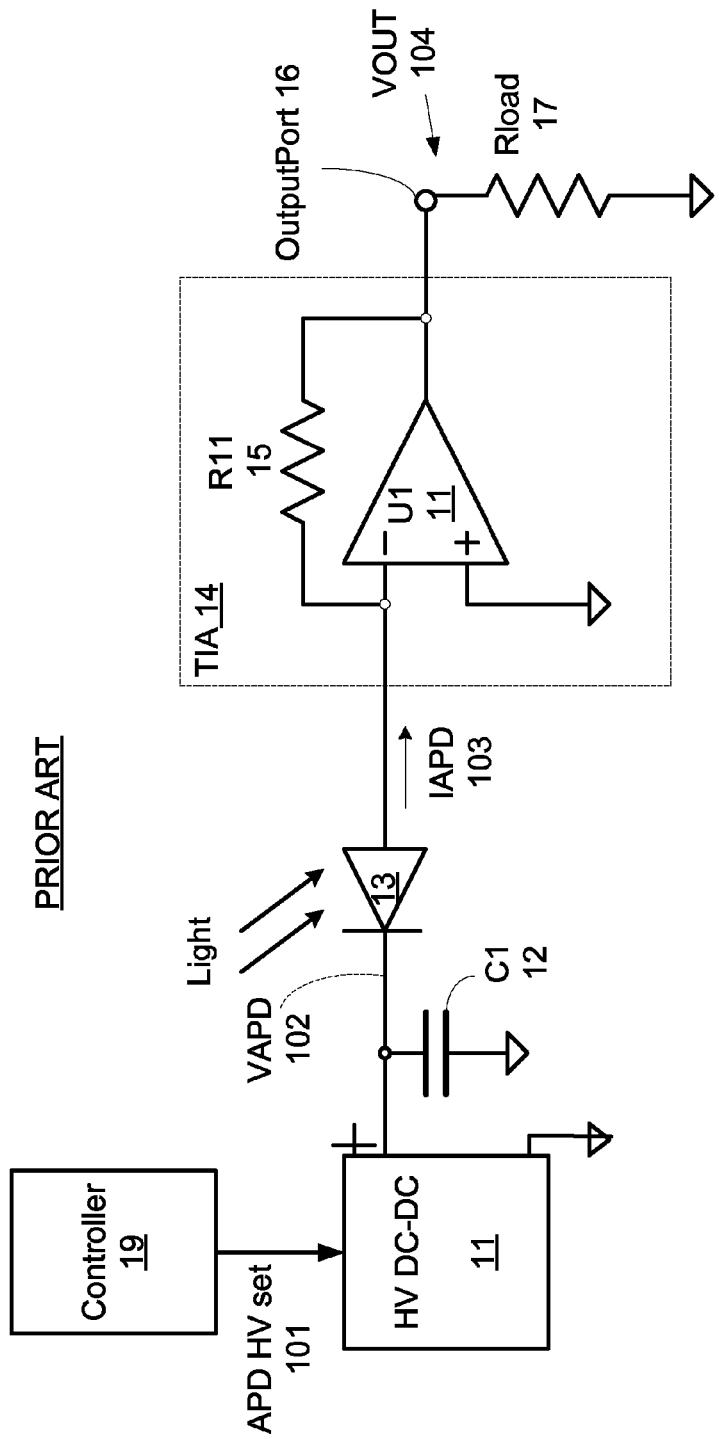
FIG. 1 illustrates a prior art device.
Figure 2:
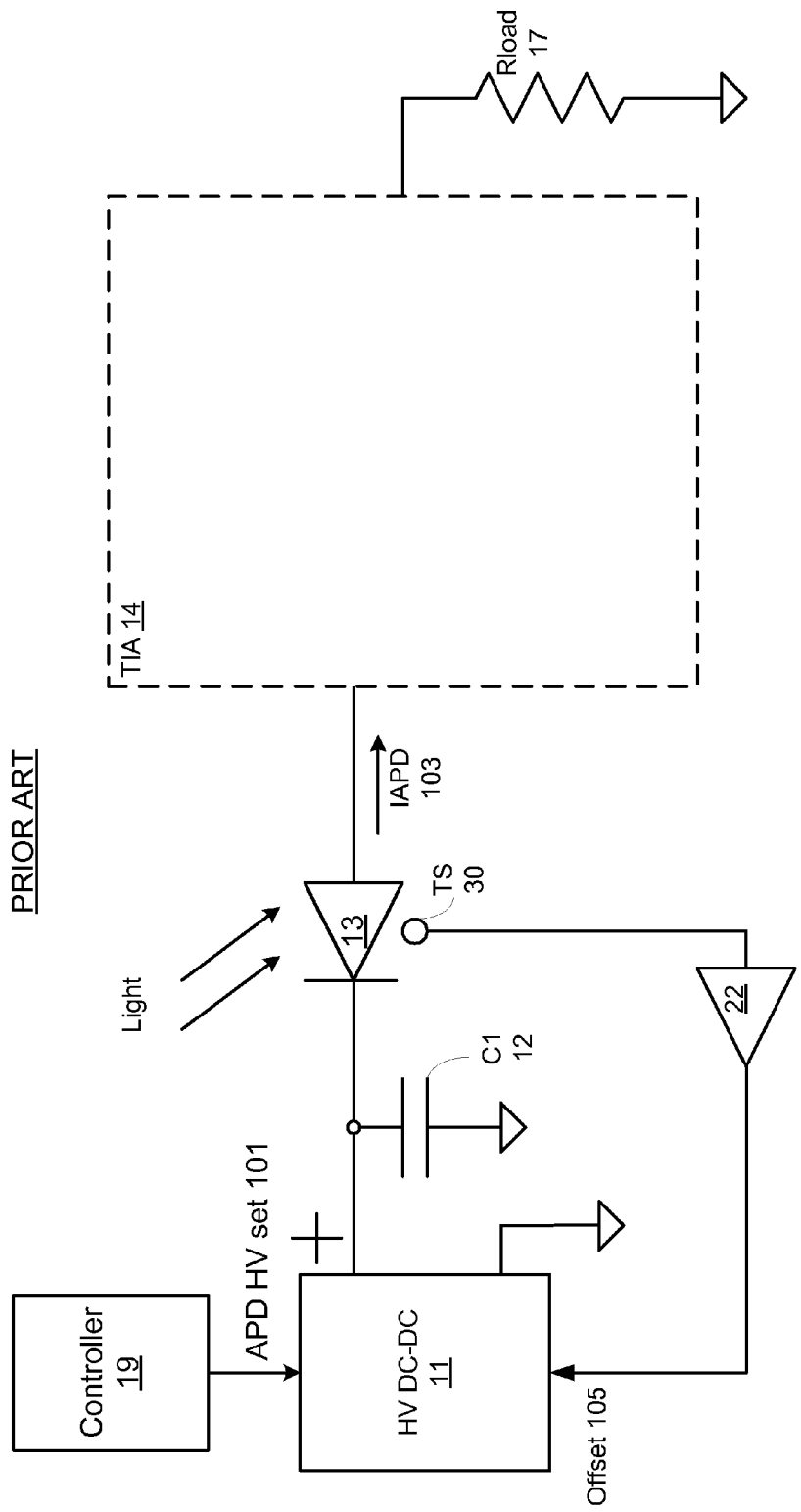
FIG. 2 illustrates a prior art device.
Figure 3:
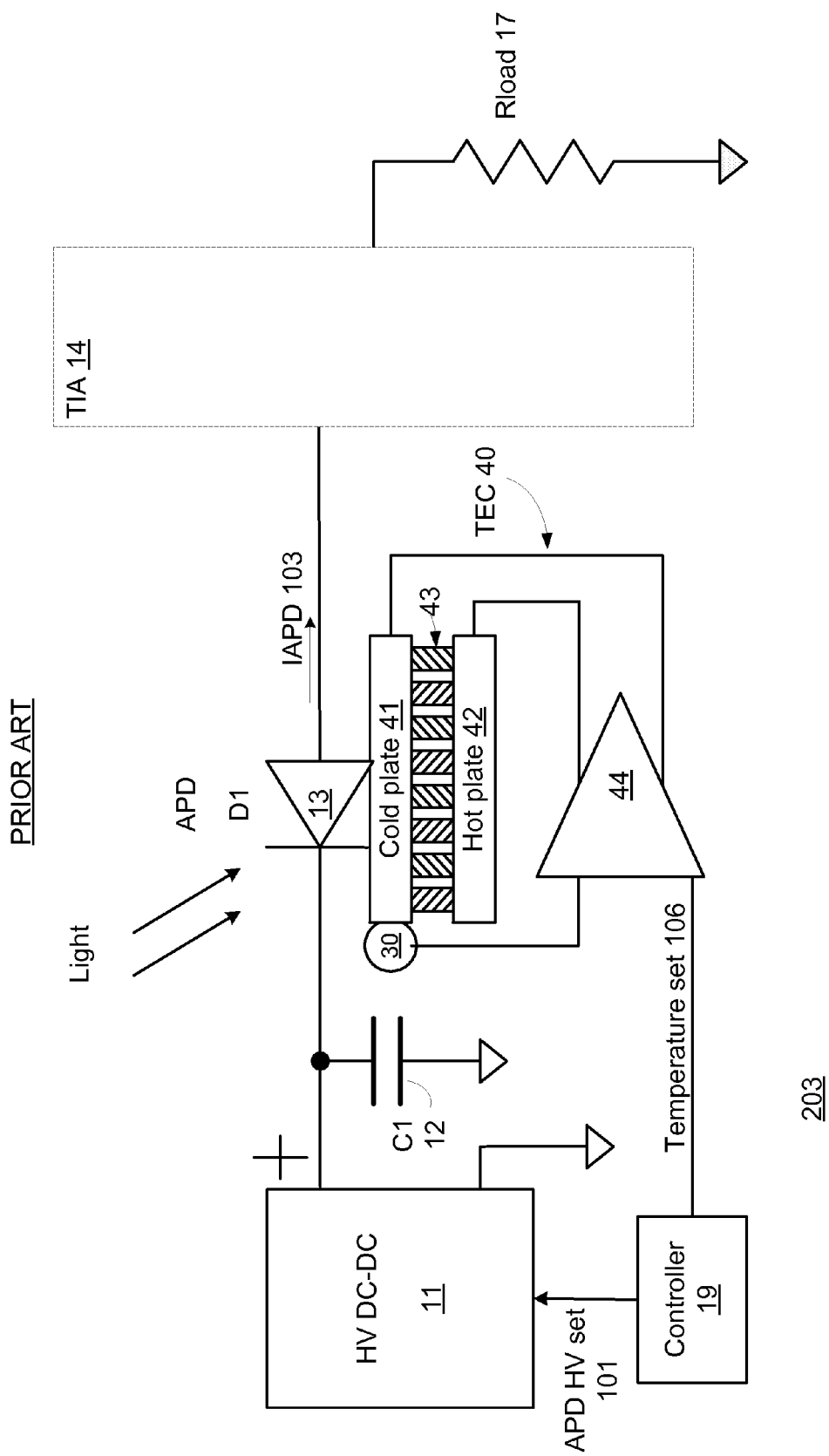
FIG. 3 illustrates a prior art device.
Figure 4:
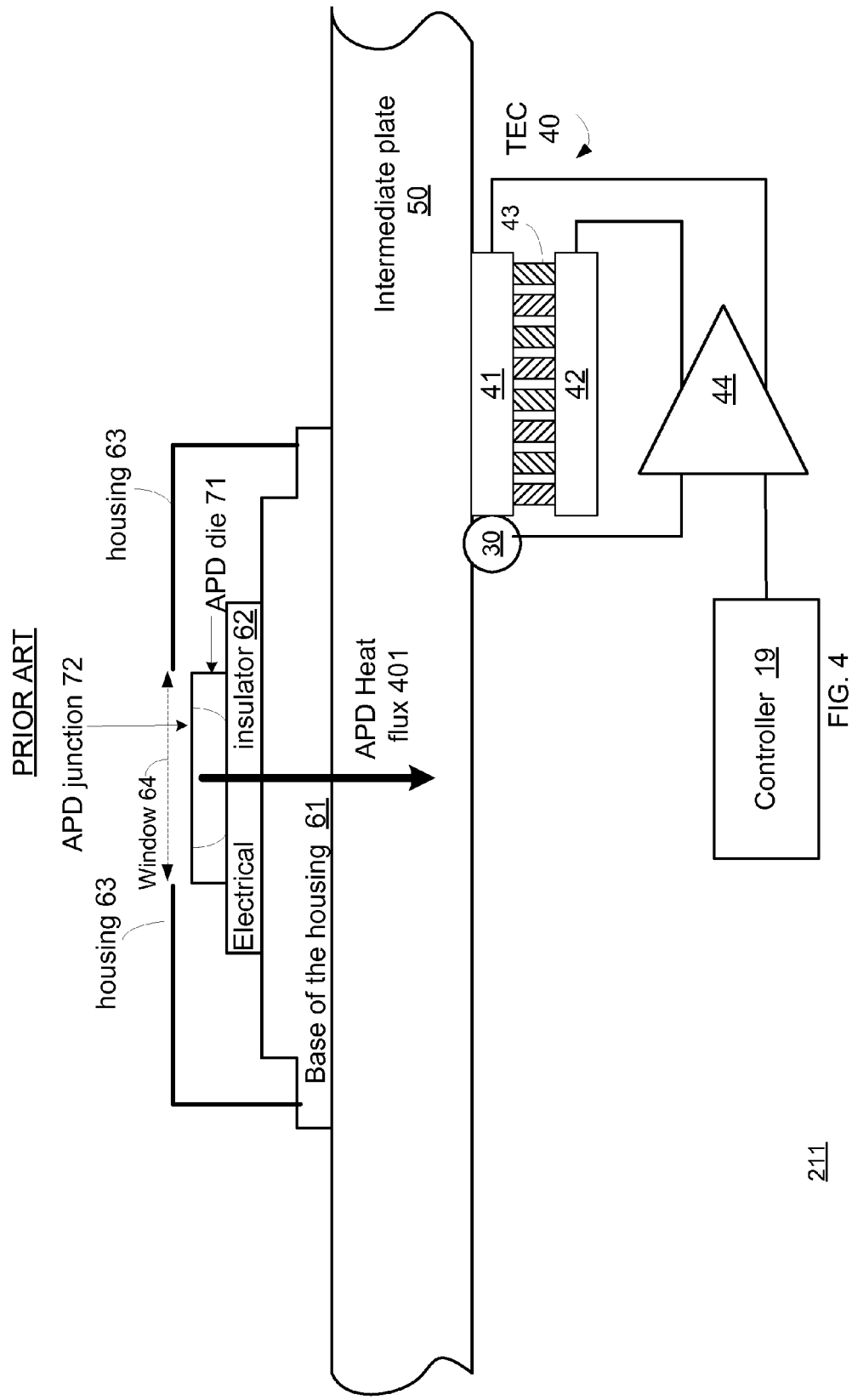
FIG. 4 is a cross sectional view of a portion of a prior art device.
Figure 5:
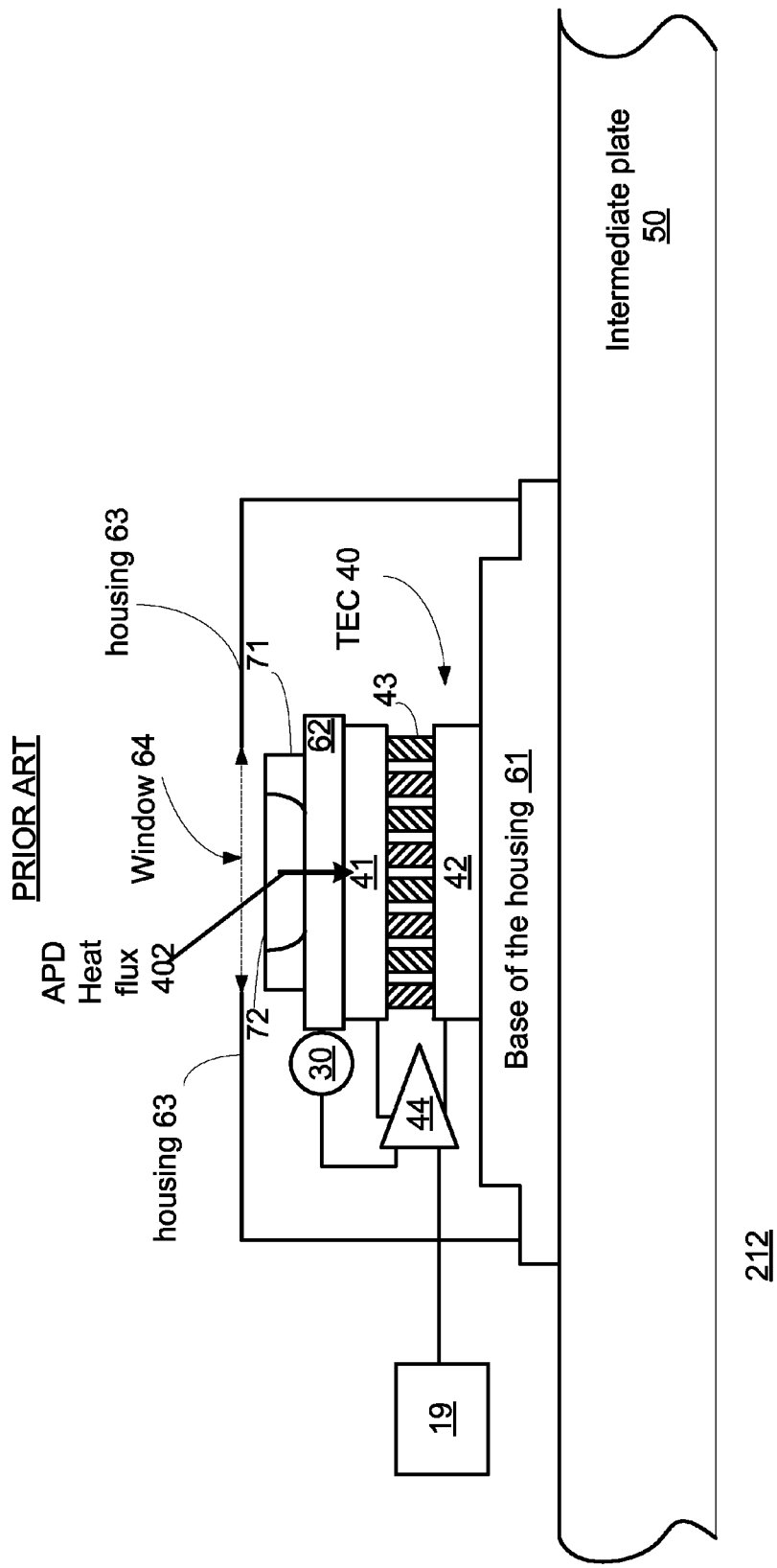
FIG. 5 is a cross sectional view of a portion of a prior art device.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DESCRIPTION OF THE PREFERRED EMBODIMENTS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Figure 6:
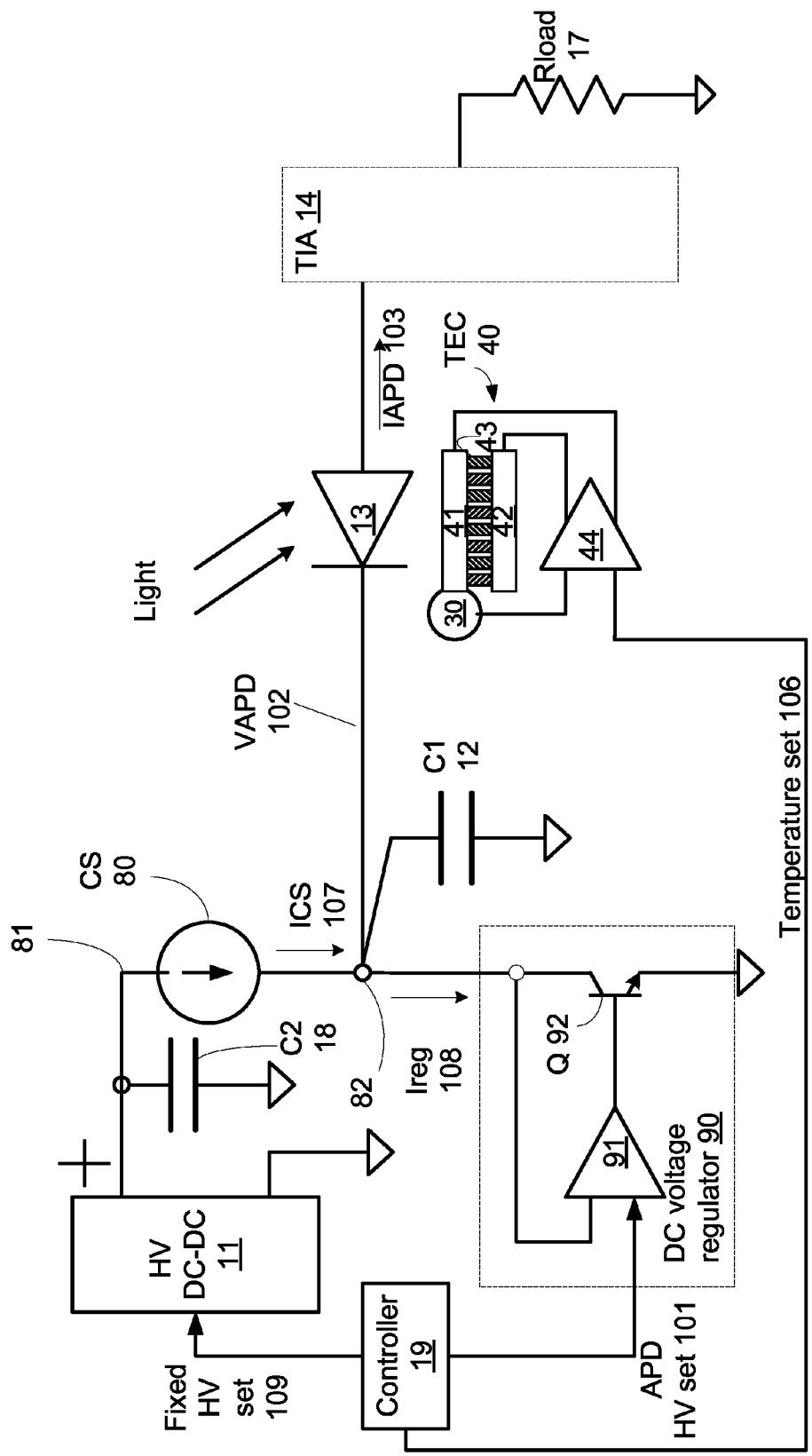
FIG. 6 illustrates a device according to an embodiment of the invention.

FIG. 6 illustrates a device 204 according to an embodiment of the invention.

Device 204 is connected to a load that is represented by Rload 17. Device 204 includes: (a) Controller 19. (b) DC-DC converter 11. DC-DC converter 11 is controlled by control signal fixed HV set 109 that is supplied by controller 19. Control signal fixed HV set 109 controls the output voltage of the DC-DC converter 11. (c) APD 13. (d) First capacitor C1 12 that filters the voltage supplied to the APD 13. (e) TIA 14. (f) TEC controller 44 g. (g) A temperature control module such as TEC 40. TEC 40 includes cold plate 41, hot plate 42, TS 30 and solid state devices 43. Solid state devices 43 transfer heat from cold plate 41 to hot plate 42 under the control of TEC controller 44.

TS 30 is for sensing the temperature of APD 13 or of cold plate 41. TS 30 provides its temperature readings to TEC controller 44. TEC controller 44 is also controlled by a temperature set signal 106 from controller 19.

Device 204 also includes (h) A DC voltage regulator 90 that may be a shunt DC voltage regulator. DC voltage regulator 90 includes regulating transistor Q 92 and operational amplifier 91. Operational amplifier 91 is fed by control signal APD HV set 101 (from controller 19) and by a feedback signal provided from an output port of the DC voltage regulator 90. The collector of transistor Q2 is connected to the output port of the DC voltage regulator 90. (h) Fixed current source CS 80 and (i) Second capacitor C2 18 for filtering the output voltage of the DC-DC converter 11. Either one of C1 12 and C2 18 can be replaced by any filtering circuit.

The positive node of DC-DC converter 11, a first end of second capacitor C2 18, and a first port of fixed current source CS 80 are connected to first junction 81. The second end of capacitor C2 18 is grounded.

The output terminal of fixed current source CS 80, a first end of first capacitor C1 12, a cathode of APD 13 and an output port of DC voltage regulator 90 are connected to second junction 82.

The anode of APD 13 is connected to an input port of TIA 14. Cold plate 41 (or an intermediate plate that is not shown in FIG. 6) is connected to the APD 13, to the packaging of the APD or to an electrical insulator connected to an APD die.

Fixed current source CS 80 drives a fixed current ICS 107 into the second junction 82. DC voltage regulator 90 maintains the potential of the second junction 82 to a regulated voltage of a fixed value.

The regulated voltage equals the voltage of the APD-VAPD 102.

Fixed current ICS 107 is split between APD (IAPD 103) and Ireg 108. Ireg 108 flows through DC voltage regulator 90. Ireg 108 flows through regulating transistor Q 92.

IAPD 103 and Ireg 108 may equal fixed current ICS 107. It is noted that the currents that flow through a feedback loop and into operational amplifier 91 and through first capacitor C1 12 are insignificant and can be ignored of. Accordingly, it may be assumed that ICS=Ireg+IAPD.

The DC voltage regulator 90 may have a relatively low response time and may respond to changes in VAPD very quickly. Furthermore, the regulated voltage outputted by the DC voltage regulator 90 is much smoother and exhibits much less noise that the output voltage of DC-DC converter 11. Device 204 also exhibits an inherent fast APD current limiting function.

Figure 7:
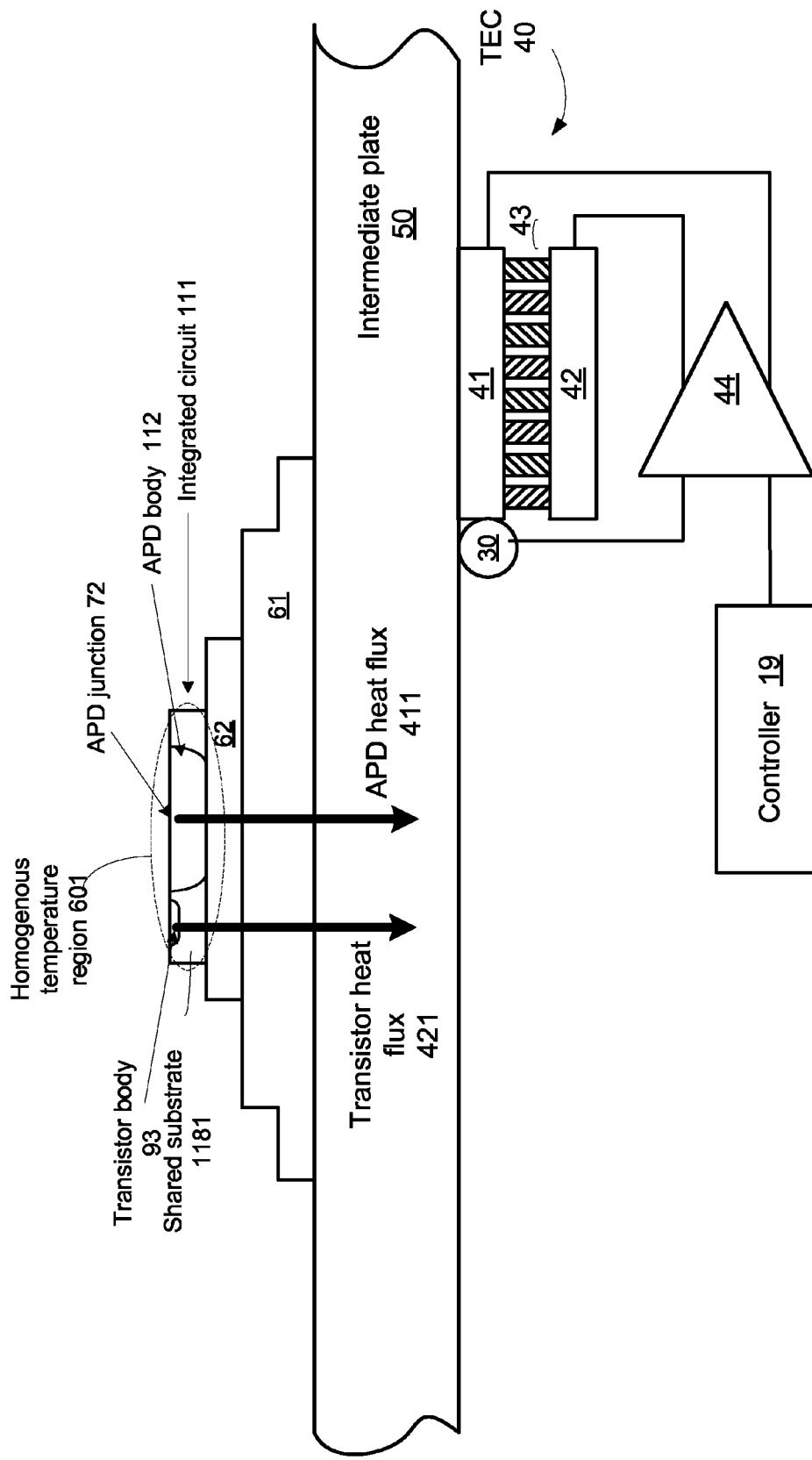
FIG. 7 is schematic diagram of a portion of a device according to an embodiment of the invention.

FIG. 7 is schematic diagram of a portion 213 of device 204 according to an embodiment of the invention.

Portion 213 includes controller 19, TEC 40, intermediate plate 50, integrated circuit 111, base 61 and electrical insulator 62. Electrical insulator 62 is located between integrated circuit 111 and base 61. The cold plate 41 of TEC 40 cools intermediate plate 50. TS 30 senses the temperature of cold plate 41. TEC 40 also includes hot plate 42, solid state devices 43 and TS 30. TEC 40 is controlled by TEC controller 44. The APD has an APD junction 72 that is light sensitive.

Integrated circuit 111 includes both APD and the regulating transistor and the cross sectional view illustrates it as including the transistor body 93 and the APD body 112 and a shared substrate 1181. The APD and the regulating transistor share the same thermal environment and thus are kept at the same temperature. Accordingly—the integrated circuit 111 may form a thermally homogenous region 601.

The implementation of the APD and the regulating transistor on the same integrated circuit 111 and in proximity to each other causes both regulating transistor to be kept at the same temperature.

FIG. 7 also illustrates the heat flux 411 caused by power dissipation on APD and the heat flux 421 caused by power dissipation on the regulating transistor. The sum of those heat fluxes is constant, therefore the temperature of the integrated circuit 111 is constant.

The sum of both heat fluxes is maintained constant as they are both produced by a constant electrical power supplied to the APD 13 and the regulating transistor Q 92. The constant electrical power equals a product of a multiplication of fixed current ICS 107 by the regulated voltage of a fixed value VAPD.

Because the sum of both heat fluxes is constant there is a constant temperature difference between the temperature of the APD (and the regulating transistor) and the temperature of the cold plate 41. Accordingly—the response period of the TEC is of less importance.

Because the cold plate 41 is maintained at a constant temperature and because the sum of heat dissipated from the APD 13 and the regulating transistor is constant—the temperature of the APD is maintained constant and the APD may operate at high gain.

The gain of the APD is determined by the value of the regulated voltage.

Figure 8:
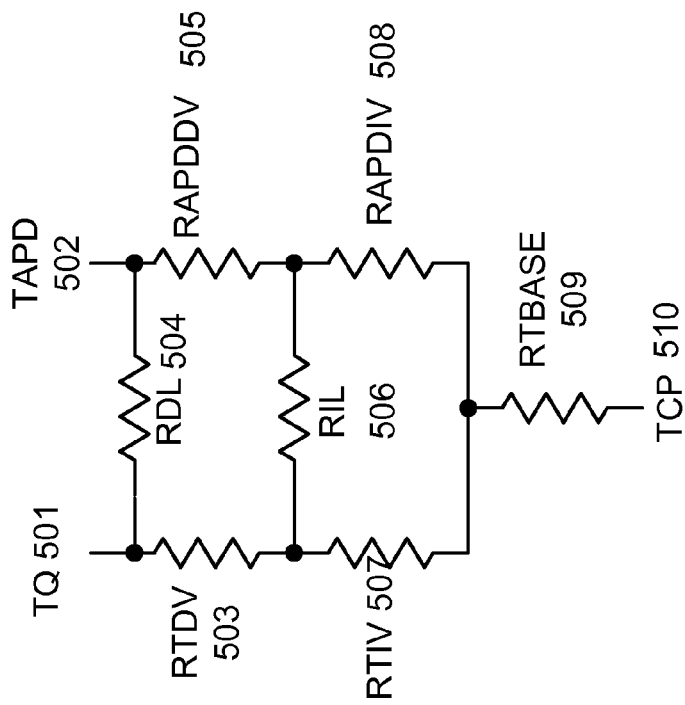
FIG. 8 is a simplified thermal circuit diagram of a portion of a device according to an embodiment of the invention.

FIG. 8 is a simplified thermal circuit diagram 500 of portion 213 according to an embodiment of the invention.

The following elements of the simplified thermal circuit diagram 500 illustrate the following: TQ 501 is the temperature of the regulating transistor. TAPD 502 is the APD temperature. TCP 510 is the temperature of cold plate 41 of TEC 40. RTDV 503 is die vertical thermal resistance related to the regulating transistor. RAPDDV 505 is die vertical thermal resistance related to APD. RDL 504 is die lateral thermal resistance between the regulating transistor and the APD. RTIV 507 is electrical insulator vertical thermal resistance related to the regulating transistor. RAPDIV 508 is an electrical insulator vertical thermal resistance related to the APD. RIL 506 is an electrical insulator lateral thermal resistance between the regulating transistor and the APD. RTBASE 509 is thermal resistance of the package base and of the intermediate plate.

A second end of RTDV 503 is connected to a second end of RDL 504 and outputs TQ 501. A second end of RTIV 507 is connected to a second end of RIL 506 and to a first end of RTDV 503. A second end of RAPDDV 505 is connected to a first end of RDL 504 and outputs TAPD 502. A second end of RAPDIV 508 is connected to a first end of RIL 506 and to a first end of RAPDDV 505. A second end of RTBASE 509 is connected to first ends of RTIV 507 and RAPDIV 508. TCP 510 is an input to a first end of RTBASE 509.

These thermal resistances should support good thermal coupling of the regulating transistor and the APD.

In voltage domain this configuration has following advantages: a. DC voltage regulator time response may be relatively fast (in the range of MHz). b. Relatively low ripple and noise may be achieved at the output of the DC voltage regulator c Inherent fast APD current limiting function. d. The first capacitor C1 12 may provide charge for tracking after fast IAPD changes even before the DC voltage regulator responds to these changes.

In temperature domain this configuration has following advantages: a. Time response of temperature compensation is very fast. b. Temperature stabilization performance is limited only by mutual thermal resistance between APD and the regulating transistor that are fabricated on the same integrated circuit and in close proximity to each other.

Figure 9:
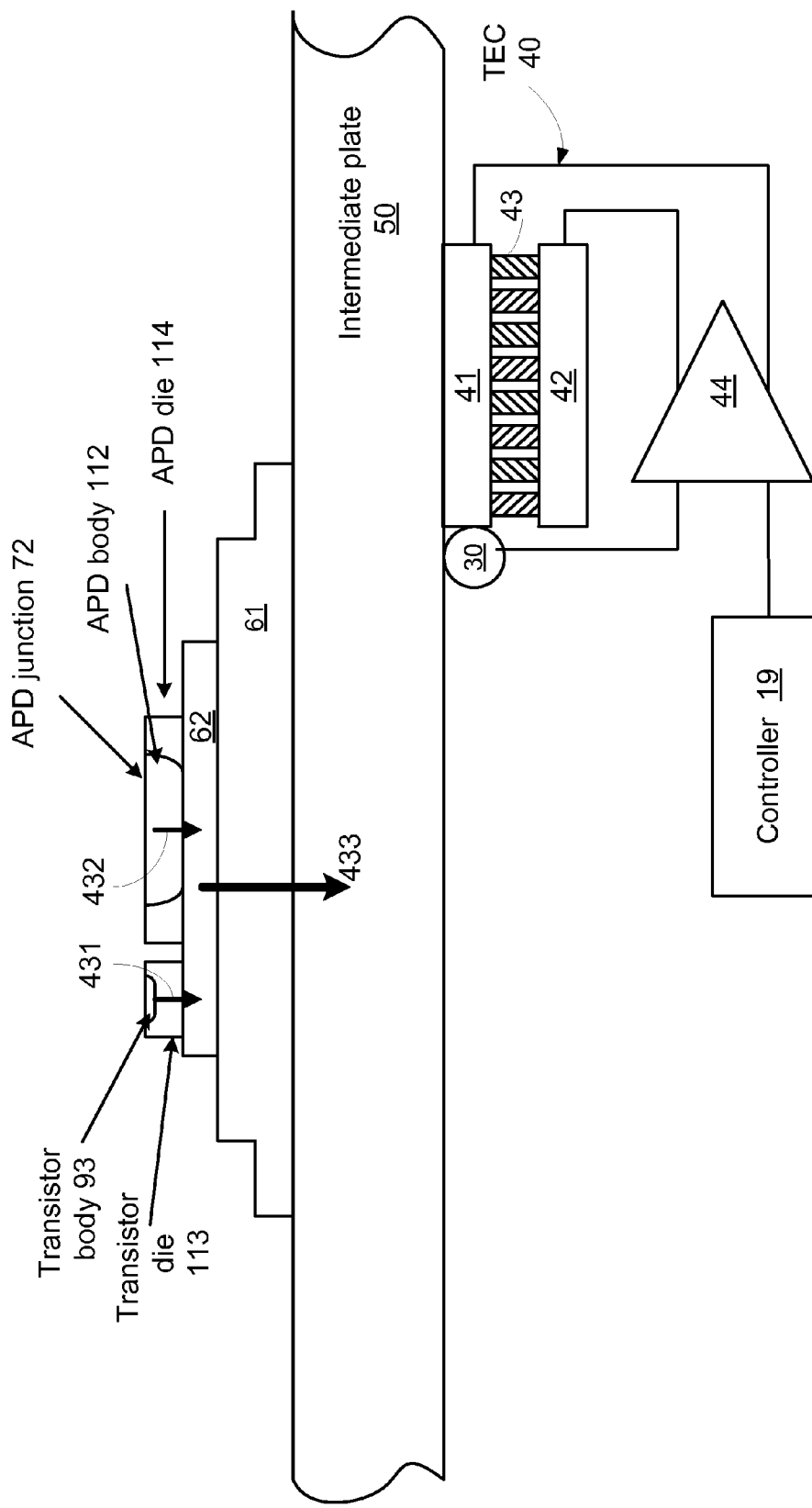
FIG. 9 is schematic diagram of a portion of a device according to an embodiment of the invention.

FIG. 9 is schematic diagram of a portion 214 of device 204 according to an embodiment of the invention. Portion 214 differs from portion 213 of FIG. 7 by having two separate dies—regulating transistor die 113 and APD die 114 instead of (single) integrated circuit 111. Such a system may be preferred from the reason of practical implementation.

The APD die 114 and the regulating transistor die 113 are supported by the electrical insulator 62 and are proximate to each other.

FIG. 9 also shows an APD heat flux 432 caused by power dissipation on APD, a heat flux 431 caused by power dissipation on the regulating transistor and a sum heat flux 433 that is a total heat flux caused by power dissipation on APD and on the regulating transistor, which is constant.

The sum of both heat fluxes is maintained constant as it equals a constant electrical power supplied to the APD 13 and the regulating transistor Q 92. The constant electrical power equals a product of a multiplication of fixed current ICS 107 by the regulated voltage of a fixed value VAPD.

Because the sum of both heat fluxes is constant there is a constant temperature difference between the temperature of the APD (and the regulating transistor) and the temperature of the cold plate 41.

Figure 10:
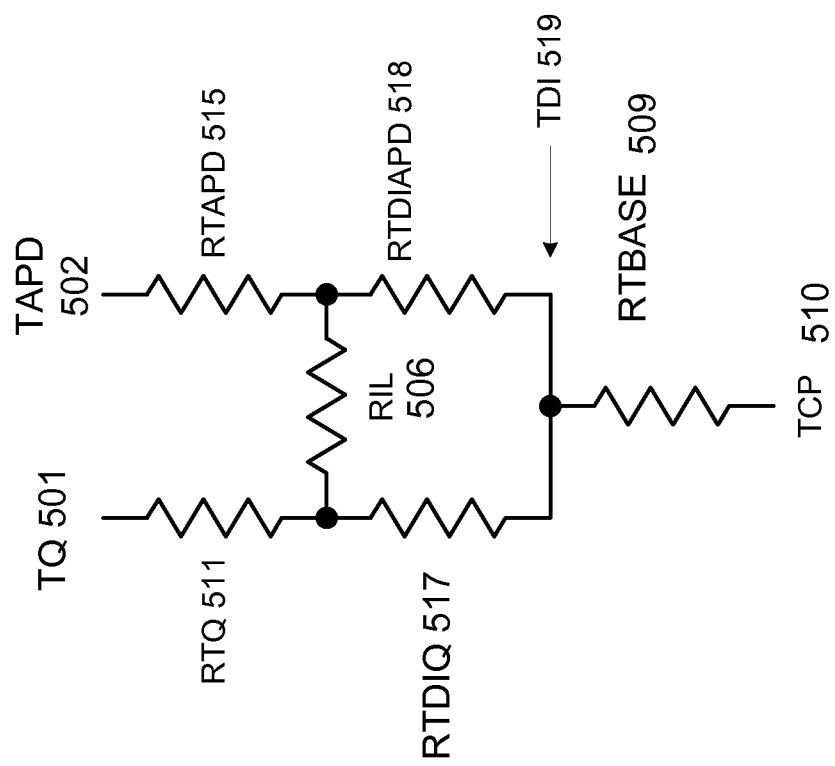
FIG. 10 is a simplified thermal circuit diagram of a portion of a device according to an embodiment of the invention.

FIG. 10 is a simplified thermal circuit diagram 550 of portion 214 according to an embodiment of the invention. The following elements of the simplified thermal circuit diagram 550 illustrate the following: TQ 501 is the temperature of the regulating transistor. TAPD 502 is the APD temperature. TD 519 is a temperature at the bottom boundary of electrical insulator 62. Electrical insulator 62 is highly thermally conductive.

TCP 510 is the temperature of cold plate 41. RTQ 511 is the thermal resistance of the regulating transistor die 113 of the regulating transistor. RIL 506 is lateral thermal resistance of highly thermally conductive electrical insulator 62 RTDIQ 517 is a vertical thermal resistance of the highly thermally conductive electrical insulator, related to the regulating transistor. RTAPD 515 is a thermal resistance of the die of the APD. RTDIAPD 518 is a vertical thermal resistance of the highly thermally conductive electrical insulator related to the APD. RTBASE 509 is a thermal resistance of a base 61 and of the intermediate plate 50 together A second end of RTQ 511 outputs TQ 501. A second end of RTDIQ 517 is connected to a second end of RIL 506 and to a first end of RTQ 511. A second end of RTAPD 515 outputs TAPD 502. A second end of RTDIAPD 518 508 is connected to a first end of RIL 506 and to a first end of RTAPD 515. A second end of RTBASE 509 is connected to first ends of RTDIQ 517 and RTDIAPD 518. TCP 510 is an input to a first end of RTBASE 509.

Figure 11:
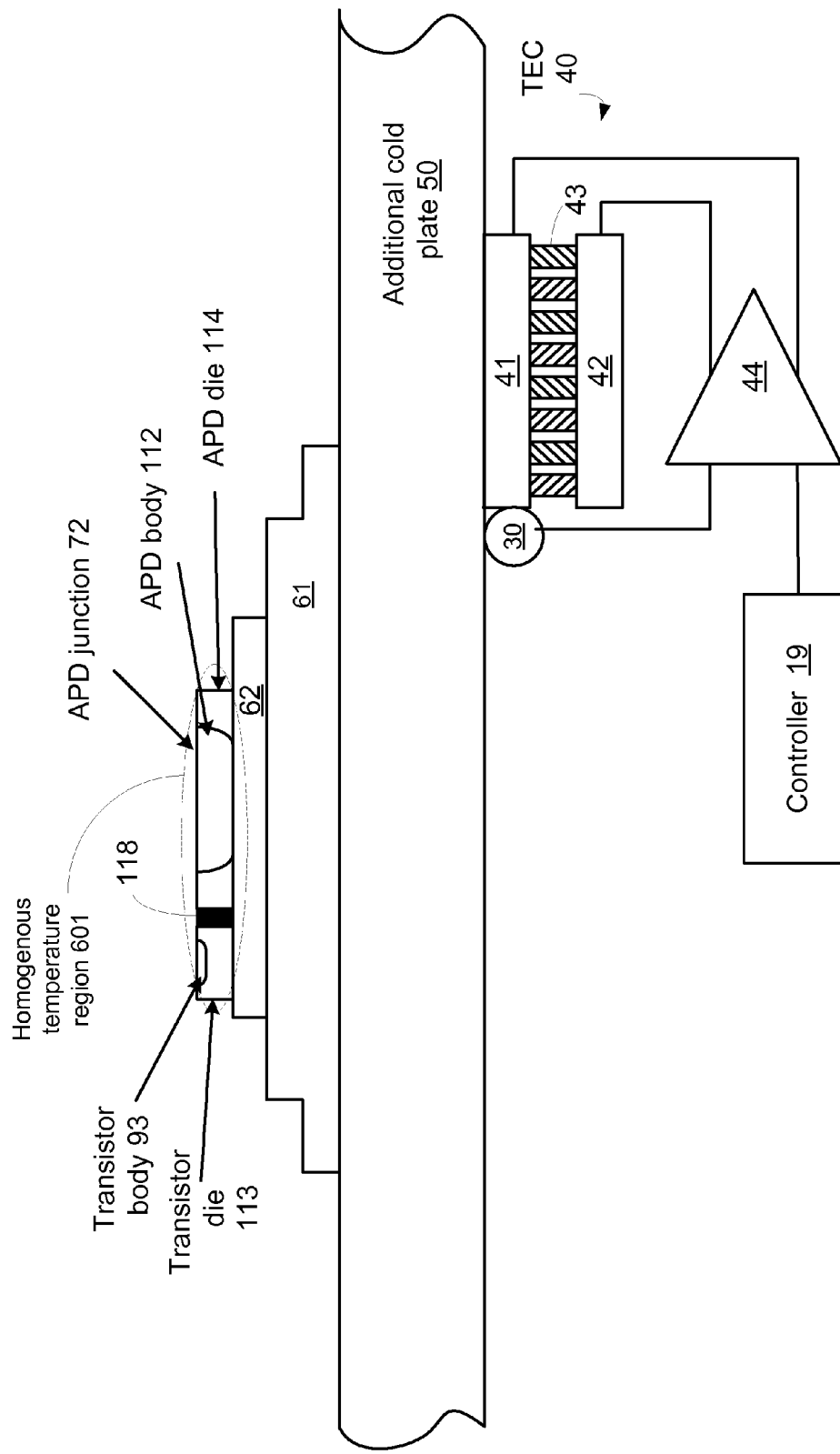
FIG. 11 is schematic diagram of a portion of a device according to an embodiment of the invention.

FIG. 11 is schematic diagram of a portion 215 of device 204 according to an embodiment of the invention.

Portion 215 differs from portion 214 by having an highly thermally conductive electrically insulating element 118 that is positioned between the regulating transistor die 113 and the APD die 114 and above the electrical insulator 62.

The highly thermally conductive electrically insulating element 118, regulating transistor die 113 and APD die 114 may form thermally homogenous region 601.

For example—thermal conductivities (a property of material) of Alumina Al2O3 ceramics is 30 Wm-1·K-1, of Silicon is 149 Wm-1K-1 and of Diamond—up to 3320 Wm-1K-1. The selection of the material from which the highly thermally conductive material element should depend upon the thermal resistance, which is a property of specific mechanical device.

The thermal resistance is Rphi=x/(A*k), wherein Rphi is is the absolute thermal resistance (across the length of the material) (K/W), x is the length of the material (measured on a path parallel to the heat flow) (m), k is the thermal conductivity of the material (W/(Km)) and A is the cross-sectional area (perpendicular to the path of heat flow) (m 2).

The invention is not limited by the type of APD, APD size and shape, APD die materials, APD manufacturing methods and more. For example, the invention can be implemented with APD may be formed on Si, GaAs, InGaAs and more; the invention is not limited to a single pixel APD. For example the invention can be implemented in a multi-pixel APD camera. The invention is further not limited by the type of insulating material. For example, electrical insulator 62 may be made of Al2O3 (Alumina), BeO, CVD diamond, natural diamond, as well as other electrical insulating material with high thermal conductivity. The invention is further not limited by the type, design and method of operation of the thermoelectric cooler (TEC) 40 and its components.

In at least some of the previous figures it was assumed that (a) the APD is coupled to a trans-impedance amplifier (TIA 14), (b) the power supply module is a DC to DC converter, (c) the APD is coupled to a first capacitor C1 12, and (d) intermediate plate 50 interfaces between base 61 and TEC 40. It is noted that these assumptions are only made for brevity of explanation. The invention is not limited by the specific electrical configuration and many modifications and variations can be implemented. For example (a) the invention is not limited by the type and specific implementation of trans-impedance amplifier; (b) various types of power supply modules other than DC-DC converters may be provided; (c) filtering circuits other than the first capacitor C1 12 may be used; (d) intermediate elements other than a plate may interface between base 61 and TEC 40 (e.g. various massive bodies with significant thermal capacity, made in various shapes and of various materials).

It is further noted that any control signals sent by controller 19 is aimed to set a working point of the TEC 40, DC-DC converter 11 and DC voltage regulator respectively.

Figure 12:
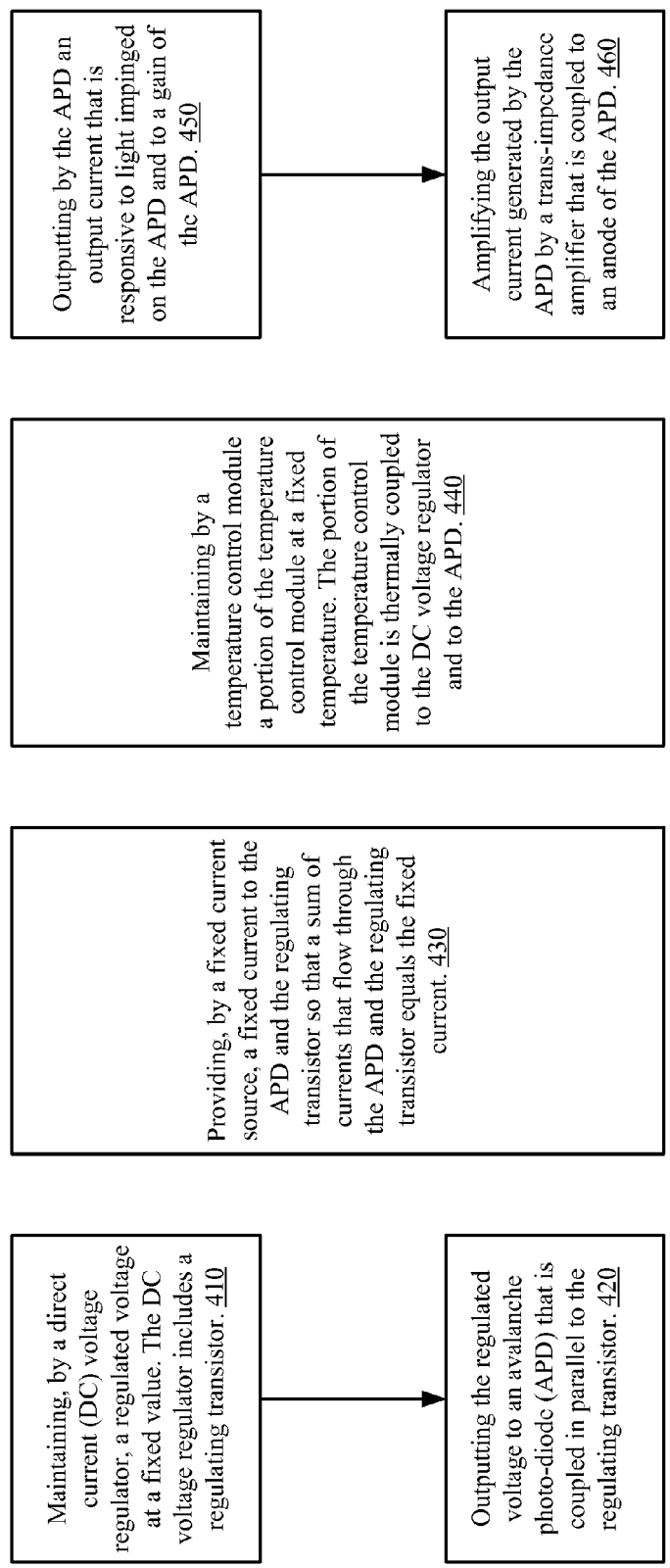
FIG. 12 illustrates a method according to an embodiment of the invention.

FIG. 12 illustrates method 400 according to an embodiment of the invention.

Method 400 may start by stages 410, 430 and 440. Stage 410 includes maintaining, by a direct current (DC) voltage regulator, a regulated voltage at a fixed value. The DC voltage regulator includes a regulating transistor. Stage 410 may be followed by stage 420 of outputting the regulated voltage to an avalanche photo-diode (APD) that is coupled in parallel to the regulating transistor.

The APD and the regulating transistor may belong to a thermally homogenous region of the device. The APD and the regulating transistor may be formed in a same die. The APD and the regulating transistor may be positioned above an electrical insulator that is electrically insulating and thermally conductive. The APD may include an APD die, the regulating transistor may include a transistor die. The transistor die and the APD die may be spaced apart from each other and are thermally coupled to each other by a thermally coupling element.

Stage 430 includes providing, by a fixed current source, a fixed current to the APD and the regulating transistor so that a sum of currents that flow through the APD and the regulating transistor equals the fixed current.

Stage 440 may include maintaining by a temperature control module a portion of the temperature control module at a fixed temperature. The portion of the temperature control module is thermally coupled to the DC voltage regulator and to the APD. The portion may be a cold plate.

Figure 13:
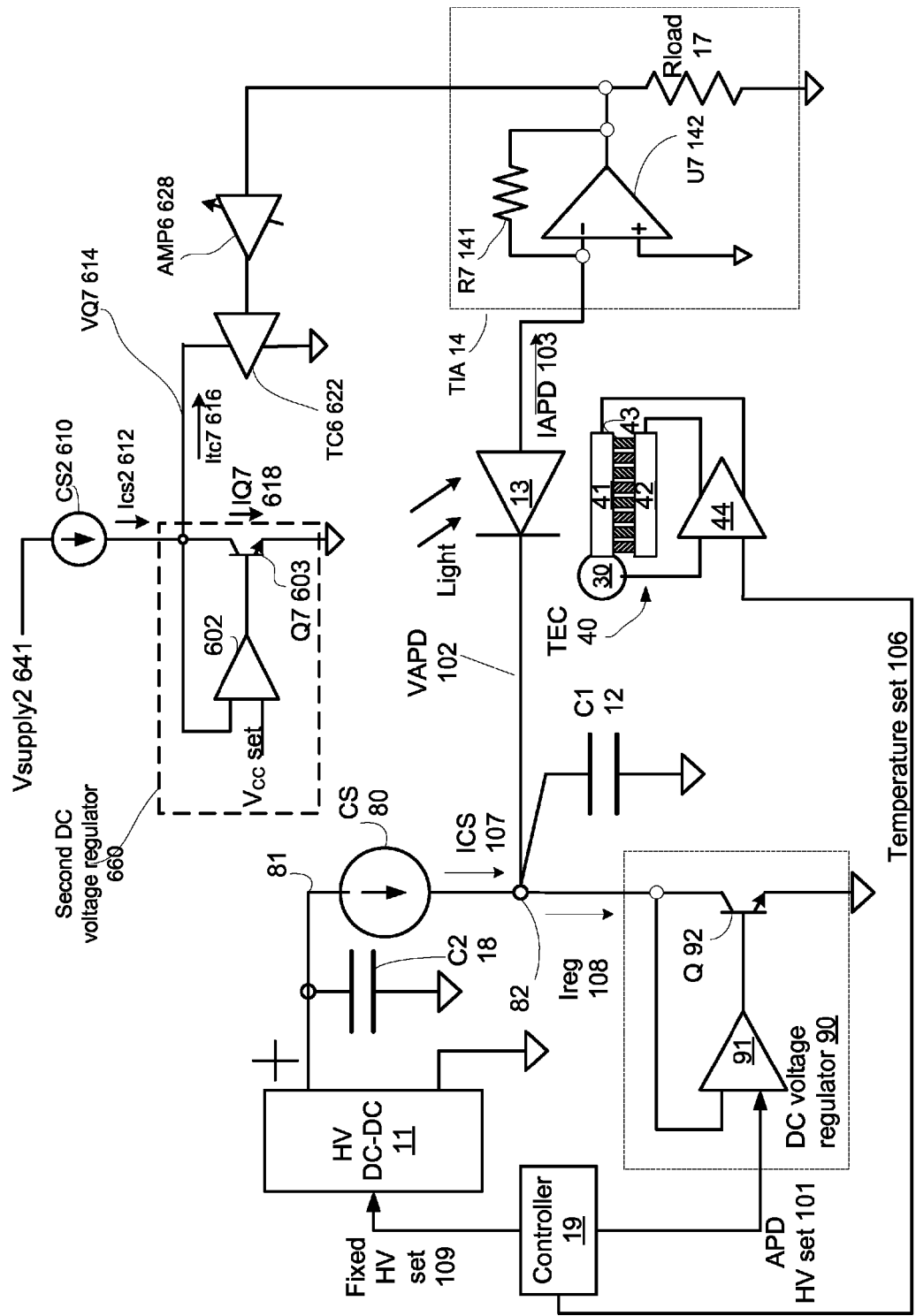
FIG. 13 illustrates a device according to an embodiment of the invention.

Method 400 may also include stage 450 of outputting by the APD an output current that is responsive to light impinged on the APD and to a gain of the APD. Stage 450 may be followed by stage 460 of amplifying the output current generated by the APD by a trans-impedance amplifier that is coupled to an anode of the APD. Stages 450 and 460 may be executed in parallel to stages 410, 420, 430 and 440. FIG. 13 illustrates a device 600 according to an embodiment of the invention.

Device 600 is connected to a load that is represented by Rload 17. Device 204 includes: (a) Controller 19; (b) DC-DC converter 11. DC-DC converter 11 is controlled by control signal fixed HV set 109 that is supplied by controller 19. Control signal fixed HV set 109 controls the output voltage of the DC-DC converter 11; (c) APD 13; (d) First capacitor C1 12 that filters the voltage supplied to the APD 13; (e) TIA 14. TIA 14 includes an operational amplifier U7 142 and a resistor R7 141 that form a transimpedance amplifier having a transimpedance (gain) that is denoted $G_{TIA6}$; (f) TEC controller 44; (g) A temperature control module such as TEC 40. TEC 40 includes cold plate 41, hot plate 42, temperature sensor (TS) 30 and solid state devices 43. Solid state devices 43 transfer heat from cold plate 41 to hot plate 42 under the control of TEC controller 44. Temperature sensor (TS) 30 is for sensing the temperature of APD 13 or of cold plate 41. TS 30 provides its temperature readings to TEC controller 44. TEC controller 44 is also controlled by a temperature set signal 106 from controller 19; (h) A DC voltage regulator 90 that may be a shunt DC voltage regulator. DC voltage regulator 90 includes regulating transistor Q 92 and operational amplifier 91. Operational amplifier 91 is fed by a control signal APD HV set 101 (from controller 19) and by a feedback signal provided from an output port of the DC voltage regulator 90. The collector of transistor Q2 is connected to the output port of the DC voltage regulator 90; (i) First fixed current source CS 80; (j) Second capacitor C2 18 for filtering the output voltage of the DC-DC converter 11. Either one of C1 12 and C2 18 can be replaced by any filtering circuit. (k) Compensation circuit that includes, in addition to TIA 14, configurable voltage amplifier AMP6 628, transconductance amplifier TC6 622 that is coupled between the configurable voltage amplifier AMP6 628 and second DC voltage regulator 660 that includes amplifier 602 and a compensation component such as transistor Q7 603. Transistor Q7 603 is fed by a second current source CS2 610. In FIG. 13 the base of transistor Q7 603 is connected to amplifier 602 that has one input connected between transistor Q7 603 to second fixed current source CS2 610. A second input of amplifier is fed with voltage Vcc set.

Transistor Q7 603 is subjected to a voltage drop (VQ7 614) that is smaller (for example less than 10%. 20%, 25%, 33%, 50%) of the voltage drop across APD 13.

Transistor Q7 603 is thermally coupled to APD 13.

Second fixed current source CS2 610 supplied second fixed current Ics2 612 to a node that is connected to transconductance amplifier TC6 622, transistor Q7 603 and amplifier 602. Current IQ7 618 flows through transistor Q7 603 and current Itc7 616 flows towards transconductance amplifier TC6 622.

The positive node of DC-DC converter 11, a first end of second capacitor C2 18, and a first port of fixed current source CS 80 are connected to first junction 81. The second end of capacitor C2 18 is grounded.

The output terminal of fixed current source CS 80, a first end of first capacitor C1 12, a cathode of APD 13 and an output port of DC voltage regulator 90 are connected to second junction 82.

The anode of APD 13 is connected to an input port of TIA 14. Cold plate 41 is connected to the APD 13, to the packaging of the APD or to an electrical insulator connected to an APD die.

First fixed current source CS 80 drives a first fixed current ICS 107 into the second junction 82. DC voltage regulator 90 maintains the potential of the second junction 82 to a regulated voltage of a fixed value.

The regulated voltage equals the voltage of the APD— VAPD 102.

The fixed current ICS 107 is split between APD (IAPD 103) and Ireg 108 that flows through DC voltage regulator 90. Ireg 108 flows through regulating transistor Q 92.

IAPD 103 and Ireg 108 may equal fixed current ICS 107. It is noted that the currents that flow through a feedback loop and into operational amplifier 91 and through first capacitor C1 12 are insignificant and can be ignored of. Accordingly, it may be assumed that ICS=Ireg+IAPD.

The DC voltage regulator 90 may have a relatively low response time and may respond to changes in VAPD very quickly. Furthermore, the regulated voltage outputted by the DC voltage regulator 90 is much smoother and exhibits much less noise that the output voltage of DC-DC converter 11. Device 204 also exhibits an inherent fast APD current limiting function.

The compensation circuit, and especially the compensation component (Q7 603 of FIG. 13) are subjected to a smaller voltage drop and thus may have a response time that is even lower than the response time of DC voltage regulator 90.

The compensation circuit (including TIA 14, AMP6 628, TC6 622, CS2 610 and second DC voltage regulator 660) performs voltage scaling down from high value of $V_{APD}$ 102 to relatively low VQ7 614.

The low value of VQ7 614 allows use of fast transistor Q7 603 which provides a base for implementation of high speed thermal compensation with low transient artifacts.

In order to keep power dissipation on both APD and Q7 603 together to be constant for each pre-defined $V_{APD}$, we need following $P_{sum} = P_{APD} \quad P_{Q7} = |VAPD \times I_{APD}| + V_{Q7} \times I_{Q7}| = const.$ Therefore an $$|I_{Q7}| = \frac{const}{|V_{Q7}|} - \left|\frac{V_{APD} \times I_{APD}}{V_{Q7}}\right| = \frac{const}{|V_{Q7}|} - \left|\frac{V_{APD}}{V_{Q7}} \times \frac{I_{TC7}}{G_{TC6} \times G_{Amp6} \times G_{TIA}}\right|,$$

where the second term is a scaled up APD current, allowing the corresponding scale down of the transistor working voltage, and a first term is a constant bias current (a value of Ics2 612), which is higher than a maximum value of the scaled up APD current.

The voltage scaling down factor is $$\left(\frac{V_{APD}}{V_{Q7}}\right),$$

and the current scaling up factor is $(G_{TC6} \times G_{Amp6} \times G_{TIA})$

For correct system operation, both scaling factors should be equal, i.e.

$$\frac{V_{APD}}{V_{Q7}} = G_{TC6} \times G_{Amp6} \times G_{TIA}.$$

The practical implementation may include a high speed trans-conductor TC6, transforming a voltage into the current.

A value of $V_{APD}$ sets the APD internal gain and it may be set to different values according to system application need.

This will change a scaling factor, which will distort an operation of the thermal compensation loop. In order to eliminate such a possible negative influence, an amplifier gain $G_{Amp6}$ or a trans-conductor gain $G_{TC6}$ may be adjusted by the way, which will keep both scaling factors to be equal.

All components, used in the thermal control loop, i.e. TIA 14, AMP6 628, TC6 622, Q7 603 and amplifier 602, may be selected to be very fast, since they are intended to work at low supply voltage, therefore they support an implementation of the wide bandwidth thermal compensation.

For example, for $$V_{APD} = 450 \text{ V}, V_{Q7} = 5 \text{ V}, G_{TIA} = 6000 \frac{\text{V}}{\text{A}}, G_{Amp6} = 2\frac{\text{V}}{\text{V}}.$$

The $$G_{TC6} = \frac{450}{5} \times \frac{1}{2 \times 6000} = 0.0075 \frac{\text{A}}{\text{V}} = 7.5 \text{ mS}$$

(milli siemens) and the scaling factor is $$\left(\frac{450}{5}\right) = 90.$$

For $I_{APD}$=320 uA this will results with $I_{Q7}$=320e−6× 90=0.0288=28.8 mA.

Changing to $V_{APD}$=225 V will require to change to so the $$G_{Amp6} = 1\frac{\text{V}}{\text{V}},$$

scaling factors will become $$\frac{225}{5} = 6000 \times 1 \times 0.0075 = 45.$$

This circuit may allow a tighter control of the APD junction temperature than in original circuit, and as result a better APD linearity at high output currents and/or higher APD gains.

Figure 14:
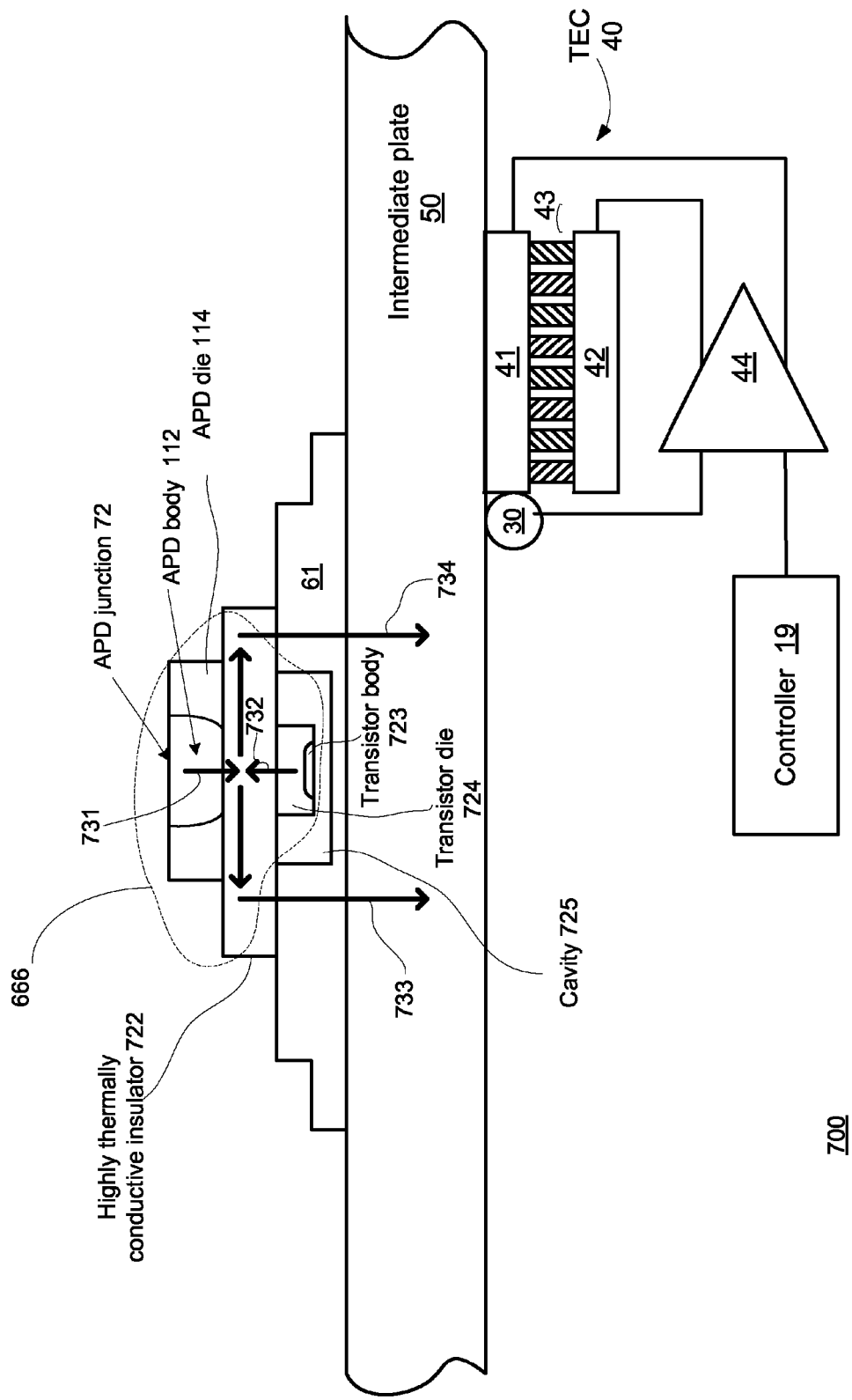
FIG. 14 is schematic diagram of a portion of a device according to an embodiment of the invention.

FIG. 14 is schematic diagram of a portion 700 of device 600 according to an embodiment of the invention.

Portion 700 includes controller 19, TEC 40, intermediate plate 50, APD die 114, base 61, highly thermally conductive insulator 722, transistor die 724 and cavity 725.

Highly thermally conductive insulator 722 is highly thermally conductive but is electrically insulating.

Transistor body 723 belongs to transistor Q7 603 of FIG. 13. Transistor body 723 interfaces with transistor die 724. Transistor die 724 is positioned within cavity 725 that is formed in base 61. Base 61 can be made of a material that has a low thermal conductivity and a low electrical conductivity.

The upper surface of the transistor die 724 and the cavity 725 interface with a lower surface of highly thermally conductive insulator 722.

APD die 114 interfaces with an upper surface of highly thermally conductive insulator 722. APD die 114 includes APD junction 72 and APD body 112. Base 61 is positioned above intermediate plate 50.

The cold plate 41 of TEC 40 cools intermediate plate 50. TS 30 is arranged to sense the temperature of cold plate 41. TEC 40 also includes hot plate 42, solid state devices 43 and TS 30. TEC 40 is controlled by TEC controller 44. The APD has an APD junction 72 that is light sensitive.

The APD and the transistor Q7 share the same thermal environment, dissipate together a constant power and thus are kept at the same temperature. Accordingly—APD die 114, highly thermally conductive insulator 722, transistor body 723 and transistor die 724 may form a thermally homogenous region 666.

FIG. 14 also illustrates the following heat fluxes:
a. Transistor heat flux 732 that is generated by transistor body 723 and flows upwards towards the highly thermally conductive insulator 722.
b. APD heat flux 731 that is generated by APD body 112 and flows downwards towards the highly thermally conductive insulator 722.
c. Right heat flux 734 and left heat flux 733 that propagate through the highly thermally conductive insulator 722 from the right and the left to the cavity 725, propagate through base 61 and intermediate plate 50.

The sum of a current that pass through the APD and a current that passes through the compensation component is fixed.

Accordingly—the sum of heat fluxes 733 and 734 is constant because they produced by the sum of power dissipated on APD and transistor Q7 together.

Because the sum of both heat fluxes is constant there is a constant temperature difference between the temperature of the APD (and the Q7) and the temperature of the cold plate 41. Accordingly—the response period of the TEC is of less importance.

Because the cold plate 41 is maintained at a constant temperature and because the sum of currents that pass through the APD 13 and Q7 is constant—the temperature of the APD is maintained constant and the APD may operate at high gain.

The gain of the APD is determined by the value of the regulated voltage.

Figure 15:
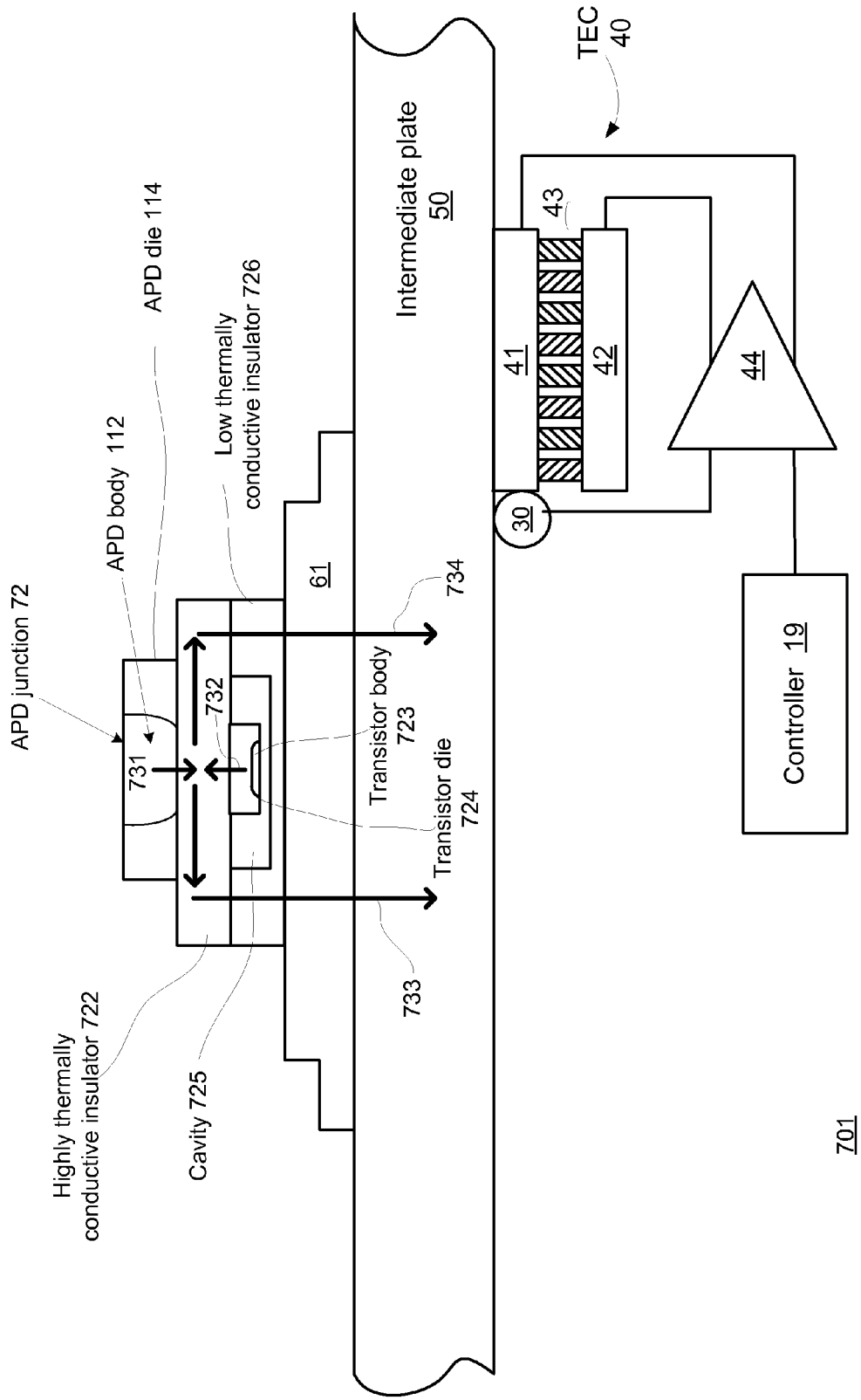
FIG. 15 is schematic diagram of a portion of a device according to an embodiment of the invention.

FIG. 15 is schematic diagram of a portion 701 of device 600 according to an embodiment of the invention.

Portion 701 differs from portion 700 of FIG. 14 by including low thermally conductive insulator 726 between base 61 and highly thermally conductive insulator 722. The transistor body 723, transistor die 724 and cavity 725 are formed within low thermally conductive insulator 726 and not within base 61.

Figure 16:
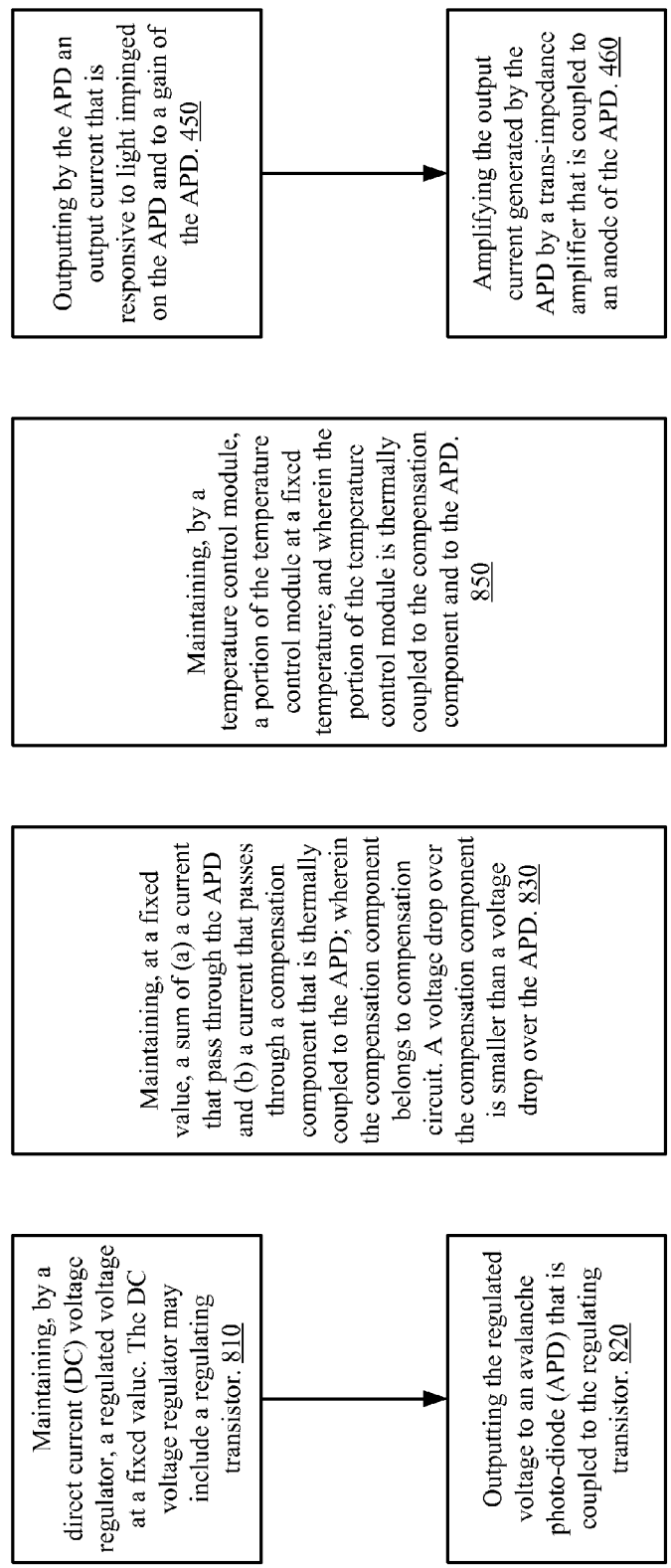
FIG. 16 illustrates a method according to an embodiment of the invention.

FIG. 16 illustrates method 800 according to an embodiment of the invention.

Method 800 includes step 810 of maintaining, by a direct current (DC) voltage regulator, a regulated voltage at a fixed value; wherein the DC voltage regulator comprises a regulating transistor.

Step 810 is followed by step 820 of outputting the regulated voltage to an avalanche photo-diode (APD) that is coupled to the regulating transistor;

Method 800 also includes step 830 of maintaining, at a fixed value, a sum of (a) a current that pass through the APD and (b) a current that passes through a compensation component that is thermally coupled to the APD; wherein the compensation component belongs to compensation circuit; wherein a voltage drop over the compensation component is smaller than a voltage drop over the APD.

Step 830 may include using a compensation circuit that monitors and maintains a fixed relationship between the voltage drop over the APD and the voltage drop over the compensation component and a fixed and the opposite relationship between the current through the APD and the current through the compensation element.

Method 800 also includes step 840 of maintaining, by a temperature control module, a portion of the temperature control module at a fixed temperature; and wherein the portion of the temperature control module is thermally coupled to the compensation component and to the APD.

Method 800 may also include stage 450 of outputting by the APD an output current that is responsive to light impinged on the APD and to a gain of the APD.

Stage 450 may be followed by stage 460 of amplifying the output current generated by the APD by a trans-impedance amplifier that is coupled to an anode of the APD.

Stages 450 and 460 may be executed in parallel to stages 410, 420, 430 and 440.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A device, comprising:
    a direct current (DC) power supply coupled to a fixed current source;
    an avalanche photo-diode (APD);
    a DC voltage regulator that comprises a regulating transistor, arranged to maintain a regulated voltage at a fixed value over different APD currents;
    a temperature control module that is arranged to maintain a portion of the temperature control module at a fixed temperature;
    a compensation circuit that comprises a compensation component that is thermally coupled to the APD;
    wherein a voltage drop over the compensation component is smaller than a voltage drop over the APD;
    wherein a sum of (a) a current that passes through the APD and (b) a current that passes through the compensation component is fixed; and
    wherein the portion of the temperature control module is thermally coupled to the compensation component and to the APD.

2. The device according to claim 1, wherein the voltage drop over the compensation component is smaller than one fourth of the voltage drop over the APD.

3. The device according to claim 1, wherein the voltage drop over the compensation component is smaller than one fifth of the voltage drop over the APD.

4. The device according to claim 1, wherein the voltage drop over the compensation component is smaller than one tenth of the voltage drop over the APD.

5. The device according to claim 1, wherein the APD and the compensation component belong to a thermally homogenous region of the device.

6. The device according to claim 1, wherein the APD and the compensation component are thermally coupled by being formed in a same die.

7. The device according to claim 1, wherein the APD and the compensation component are positioned at opposite sides of a thermally conductive electrical insulating layer.

8. The device according to claim 1 wherein the APD comprises an APD die and the compensation component comprises a compensation component die; wherein the device further comprises a thermally coupling element; and wherein the compensation component die and the APD die are spaced apart from each other and are thermally coupled to each other by the thermally coupling element.

9. The device according to claim 1 wherein the portion of the temperature control module is a cooling plate of the temperature control module.

10. The device according to claim 1, wherein the compensation component is a transistor.

11. The device according to claim 1 wherein the compensation circuit comprises (i) a trans-impedance amplifier that is coupled between an anode of the APD and an output port of the device, (ii) a configurable voltage amplifier, (iii) a trans-conductance amplifier that is coupled between the configurable voltage amplifier and the in parallel to the compensation component.

12. The device according to claim 11 wherein (a) a ratio between the voltage drop over the APD and the voltage drop over the compensation component equals (b) a product of a trans-impedance of the trans-impedance amplifier, a gain of the configurable voltage amplifier and a transimpedance of the trans-conductance amplifier.

13. The device according to claim 1 comprising a first current source for feeding, with a first fixed current, a junction that is coupled to the APD and regulating transistor.

14. A method, comprising:

maintaining, by a direct current (DC) voltage regulator, a regulated voltage at a fixed value; wherein the DC voltage regulator comprises a regulating transistor;

outputting the regulated voltage to an avalanche photodiode (APD) that is coupled to the regulating transistor;

maintaining, at a fixed value, a sum of (a) a current that passes through the APD and (b) a current that passes through a compensation component that is thermally coupled to the APD; wherein the compensation component belongs to compensation circuit; wherein a voltage drop over the compensation component is smaller than a voltage drop over the APD; and maintaining, by a temperature control module, a portion of the temperature control module at a fixed temperature; and wherein the portion of the temperature control module is thermally coupled to the compensation component and to the APD.

* * * * *